United States Patent
Pyo et al.

(10) Patent No.: US 6,658,631 B1
(45) Date of Patent: Dec. 2, 2003

(54) METHOD AND SYSTEM FOR DYNAMICALLY GENERATING RESISTANCE, CAPACITANCE, AND DELAY TABLE LOOK-UPS

(75) Inventors: Iksoo Pyo, Hillsboro, OR (US); Artour Levin, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/539,474

(22) Filed: Mar. 30, 2000

(51) Int. Cl.$^7$ .............................................. G06F 17/50
(52) U.S. Cl. .................. 716/4; 716/5; 716/6
(58) Field of Search ................ 716/4, 5, 6, 8, 716/10, 18

(56) References Cited

U.S. PATENT DOCUMENTS 5,629,860 A * 5/1997 Jones et al. .................... 716/6
5,636,130 A * 6/1997 Salem et al. .................... 716/6
6,014,508 A * 1/2000 Christian et al. .............. 716/13

* cited by examiner

*Primary Examiner*—Leigh M. Garbowski
*Assistant Examiner*—Brandon Bowers
(74) *Attorney, Agent, or Firm*—Blakely, Sokoloff, Taylor & Zafman LLP

(57) ABSTRACT

A method and system for generating resistance, capacitance and delay table look-ups for cell routers and placers is disclosed. The system receives statistical data describing a new net as well as a desired level of accuracy. One or more preexisting net models are divided into one or more groups, wherein the number of groups is associated with the desired level of accuracy. The system returns a table of coefficients associated with the statistical data and the one or more groups.

18 Claims, 3 Drawing Sheets

METHOD AND SYSTEM FOR DYNAMICALLY GENERATING RESISTANCE, CAPACITANCE, AND DELAY TABLE LOOK-UPS

FIELD OF THE INVENTION

The present invention relates to the field of computer systems. In particular, the present invention relates to generating resistance, capacitance and delay table look-ups for cell routers and placers.

BACKGROUND OF THE INVENTION

Computer Automated Design Tools (CAD), are developed for the placement and routing of cells during the design of integrated circuits. Cells are placed on the integrated circuit to meet specific design criteria such as minimizing the total length of the interconnects, power use, noise, or delay. One popular design criteria is the timing delay between two points connecting cells. There may be a maximum delay allowed, that is directly associated with a path that connects two points. The connection of two cells is called a net.

FIG. 1 illustrates a prior art integrated circuit including a net for interconnecting two or more nodes. Source node 120, an AND gate, is connected via net 110 to OR gate 150, NAND gate 140, and NOR gate 130. OR gate 150, NAND gate 140 and NOR gate 130 are sink nodes 160. Net 110 is in a fan-out configuration, although in alternate embodiments net 110 may only be connected to one other gate instead of three. In another embodiment, net 110 may not follow paths that are straight line paths to sink nodes 160, but instead have jogs 111, or bends in the wire connection. Net 110 may also include vias that bend wire connections through multiple metal layers in the integrated circuit 100. Source node 120, sink nodes 160, and net 110 have associated capacitances, resistances and inductances. Net 110 has an associated delay for signals from source node 120 to sink nodes 160. The delay is determined by multiple factors. These factors include the length, width, and height of net 110, the resistance and capacitance of net 110, source node 120, and sink nodes 160, the proximity of net 110 to other nets and nodes, the physical characteristics of the metal layers composing the integrated circuit and the number of vias and jogs in net 110.

CAD systems perform resistance, capacitance, and delay (RCD) estimation, but only consider a limited number of these factors when generating RCD coefficients. For example, RCD estimation has been based on a wire model that only considers the length, width, and height of the net wire connections. Furthermore, the final routing of nets is rarely the same as the routing estimated by the wire model. The routing estimates used for wire models make it highly inaccurate. RCD estimation systems of the past also suffer from slow processing at placer run time. If the RCD data is not provided to the performance driven placer engine quickly, optimization can take days to complete due to the multiple iterations required by the placer.

SUMMARY OF THE INVENTION

The present invention provides a method and system for dynamically generating resistance, capacitance, and delay table look-ups. The system receives statistical data describing a new net as well as a desired level of accuracy. One or more preexisting net models are divided into one or more groups, wherein the number of groups is associated with the desired level of accuracy. The system returns a table of coefficients associated with the statistical data and the one or more groups.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

DETAILED DESCRIPTION OF THE PREFERRED EMBODIMENT

Figure 1:
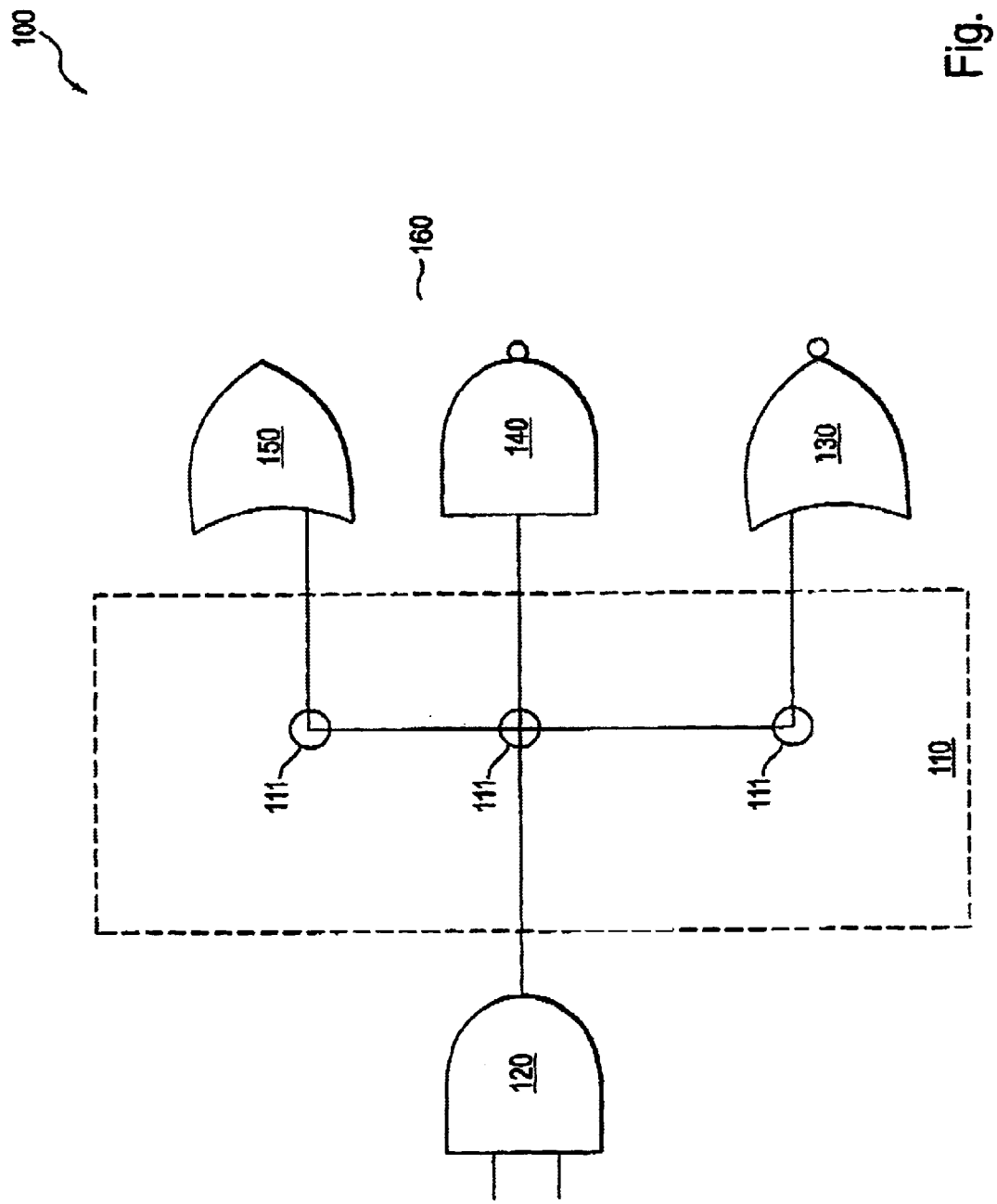
FIG. 1 illustrates a prior art integrated circuit including a net for interconnecting two or more nodes.

A method and system for dynamically generating resistance, capacitance, and delay table look-ups is described. The system receives statistical data describing a new net as well as a desired level of accuracy. One or more preexisting net models are divided into one or more groups, wherein the number of groups is associated with the desired level of accuracy. The system returns a table of coefficients associated with the statistical data and the one or more groups.

In the following description, for purposes of explanation, specific nomenclature is set forth to provide a thorough understanding of the present invention. However, it will be apparent to one skilled in the art that these specific details are not required in order to practice the present invention. For example, the present invention has been described with reference to documentary data. However, the same techniques can easily be applied to other types of data such as voice and video.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

The present system and method is described with respect to the estimation of resistance, capacitance and delay (RCD) values. The same techniques are applicable for the estimation of inductance, power, or similar design constraints. The present system and method may be applied to processes requiring fast iterative layout optimization. Furthermore, the present method and system may be implemented in generic CAD systems. For example, the present techniques can be used with CAD systems, such as, Timberwolf® manufactured by InternetCAD.com, Inc. of Dallas, Tex. and Silicon Ensemble® manufactured by Cadence Design Systems, Inc. of San Jose, Calif.

Although described with respect to a cell level design, the present system and method may be implemented at the full chip level, block level, RTL level, logic level, circuit level, and layout level. Furthermore, the present method and system may be implemented at various design stages such as floor planning, placement, and routing. For example, providing a placer with accurate estimation of the RCD coefficients dynamically, (i.e. as the placer is running), will guide the place to the optimal location on the integrated circuit and also satisfy the delay requirements of the design. Thus, the present method and system improves layout quality, reduces the number of design iterations, increases design productivity and brings products faster to market.

When a new net whose statistical data is not previously stored in a database is provided to a router and placer, the present method and system can find which net or group of nets stored in the database has the most similar behavior characteristics to the new net and generate RCD coefficients for the new net.

Figure 2:
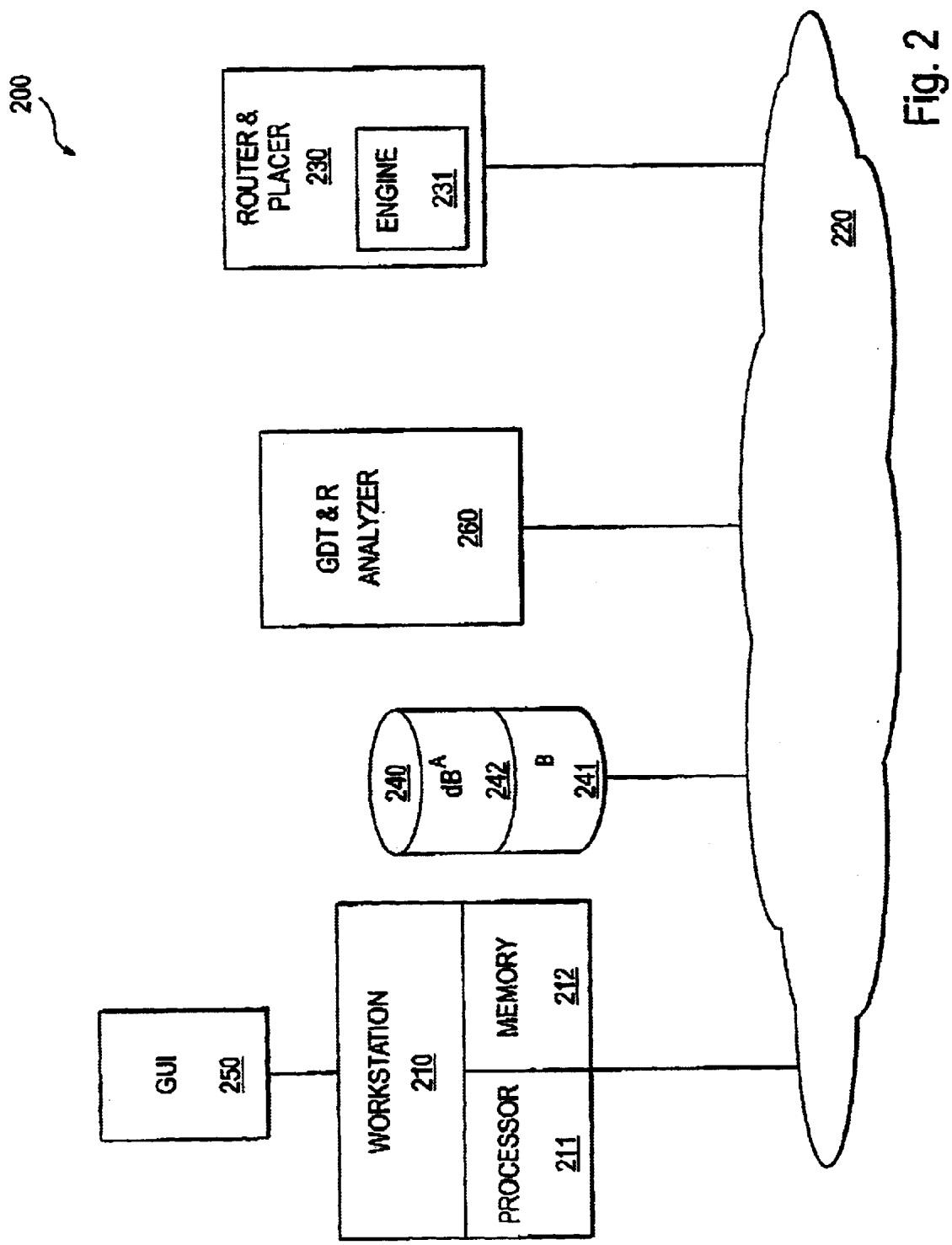
FIG. 2 is one embodiment of a dynamic RCD coefficient generating system 200.

FIG. 2 is one embodiment of a dynamic RCD coefficient generating system 200. Workstation 210 includes processor 211 and memory 212. Processor 211 is connected to memory 212. In one embodiment, the workstation 210 is an IBM® compatible personal computer (PC), an Apple® personal computer, or a SUNS® SPARC Workstation. The software implementing the functionality described herein can be stored on any storage medium accessible by workstation 210.

Workstation 210 is coupled to graphical user interface (GUI) 250. GUI 250 could be a monitor, television screen or other display device. GUI 250 displays a prompt through which a user indicates a level of accuracy that is desired for generating RCD coefficients that optimize the placement of cells on a integrated circuit. Also coupled to workstation 210 is database 240. Database 240 includes net data previously gathered from placer and router 230 in storage location A 242. Also included in database 240 is storage location B 241 that stores net data gathered from router and placers other than router and placer 230. Each router and placer implements a different manner of analyzing nets. The system 200 handles different routers and placers by gathering statistical data associated with the flow of a router and placer. System 200, then analyzes the data, normalizes it, and provides it to router and placer 230.

Global and Detailed Router and Timing Analyzer 260 is also connected to workstation 210. Analyzer 260 provides workstation 210 statistical data of a net that is to be placed on the integrated circuit. The statistical data includes the routing topology, the number of vias and jogs in the net, the number of metal layers of the integrated circuit the net will pass through, physical characteristics of the metal layers, the three dimensional characteristics of the net, and the distance between the net, and its neighboring nets, the number of pins, the driving resistance of the net, the total load capacitance of the net, the total interconnect capacitance of the net, the input capacitance of a destination node, and critical net length data. In another embodiment, the statistical data is provided by a user via GUI 250. Also coupled to workstation 210 is router and placer 230. Router and placer 230 includes placement engine 231. Workstation 210 provides router and placer 230 RCD coefficient data dynamically while taking into account the design parameters indicated by the statistical data so that the cells are placed on the integrated circuit by placer engine 231 quickly and accurately.

Workstation 210, Global and Detailed Router and Timing Analyzer 260, router and placer 230, and database 240 are interconnected via network 220. In general, the network architecture described herein may be implemented as a standard telephone connection provided through an Internet service provider to enable data communication on the Internet over a conventional telephone network. This use of the Internet as a distribution network is well known to those of ordinary skill in the art. In an alternate embodiment through the use of cable modem technology, communication may be performed over a conventional cable network in lieu of, or in addition to, communication over the telephone network. The cable network is typically much faster (e.g., provides a much greater bandwidth) than the standard telephone network; however, cable modems are typically more expensive than standard POTS (plain old telephone system) modems. In another alternate embodiment, through Integrated Services Digital Network (ISDN) technology, the network 110 is accessed using an ISDN modem. Again, the ISDN network is typically faster than the POTS network; however, access to an ISDN network is generally more expensive. Cable modems and ISDN implementations are alternative communications media to a POTS implementation.

Note that any or all of the components of the system illustrated in FIG. 2 and associated hardware may be used in various embodiments of the present invention; however, it will be appreciated by those of ordinary skill in the art that any configuration of the system may be used for various purposes according to the particular implementation.

Figure 3:
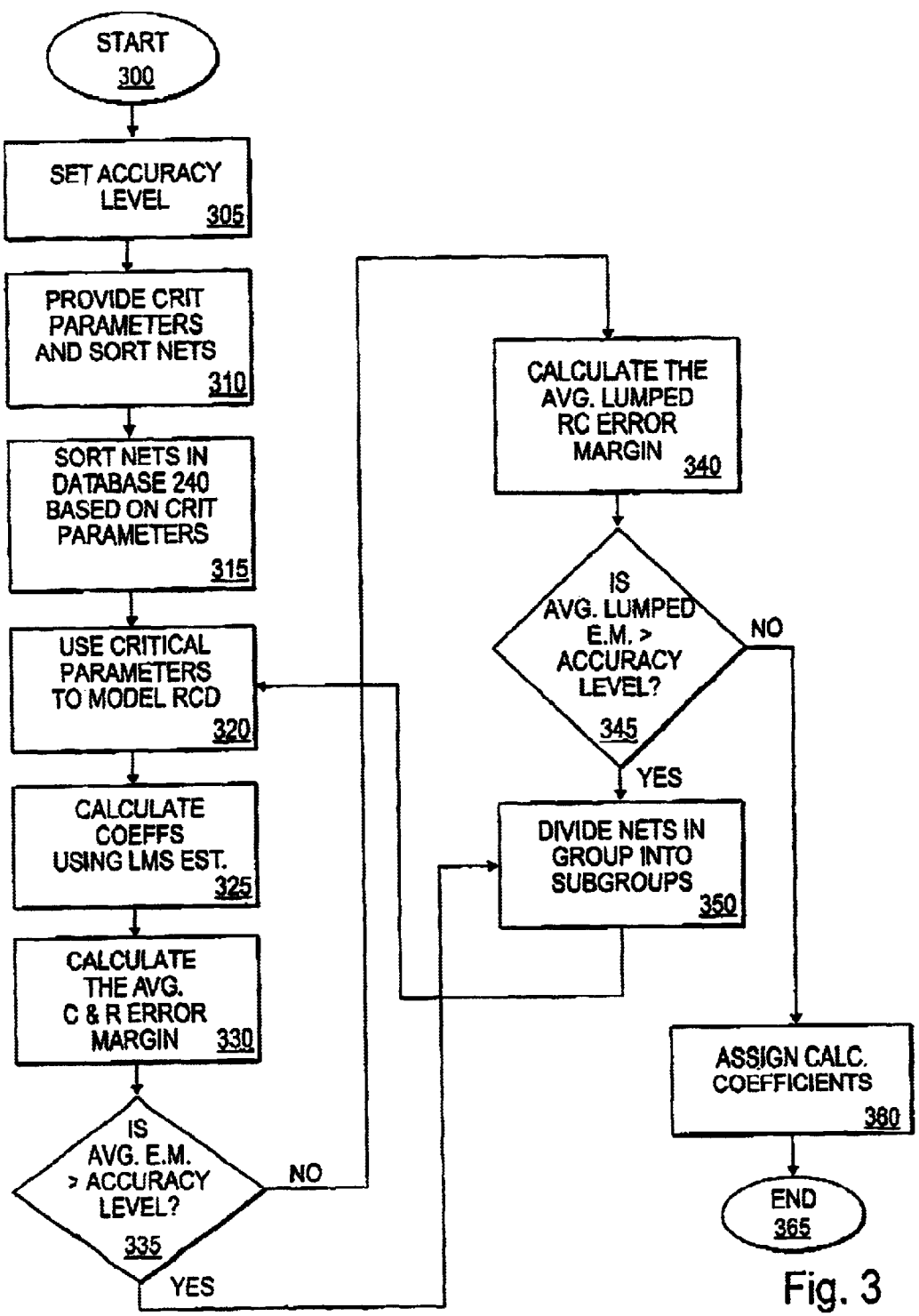
FIG. 3 is a flow diagram of one embodiment of the logic processed by workstation 210 for providing Router and Placer 230 RCD data dynamically.

FIG. 3 is a flow diagram of one embodiment of the logic processed by workstation 210 for providing router and placer 230 RCD coefficient data dynamically. System 200 analyzes a new net (e.g. a net not already stored in database 240) and finds a single net or group of nets whose behavior is similar to that of the new net. Having found similar nets, system 200 generates a table of RCD coefficients for the new net and provides it to the placer and router 230. The logic described by the flow diagram of FIG. 3 may be implemented by processor 211 of workstation 210. In other embodiments, the logic in FIG. 3 may be implemented by router and placer 230. Referring to FIG. 3, the process begins in block 300. In processing block 305 a user selects the desired accuracy of the RCD equations. The greater accuracy desired results in slower calculations of RCD coefficients. A subset of the statistical data is designated as critical parameters, such as the length of net 110, and the number of fan-outs are provided to workstation 210. The critical parameters may be extracted from an unknown net via the global, detailed timing and routing analyzer. In another embodiment the parameters are provided by the user. The database 240 is sorted so as to group together similar nets stored in database 240 based on the critical parameters in processing block 315.

The relationship between resistance, capacitance, and delay is expressed by the following equation: $D=R*C$, where D is the net delay, R is the resistance, and C is the capacitance. The RCD values may be approximated by mathematical functions. For example, $$R_{int} = r_1 \frac{l_p^h}{w_p^h} + r_2 \frac{l_p^v}{w_p^v} + r_3,$$

$C_{int} = c_1 l_n^h w_n^h + c_2 l_n^h + c_3 l_n^v w_n^v + c_4 l_n^v + c_5,$ and $$D_{int} = d_1 R_{tr}(C_L + C_{int}) + d_2 \frac{R_{int}}{2}(C_L + C_{int} + C_{in}) + d_3,$$

where $l_{n/p}^h$, $l_{n/p}^v$, $w_{n/p}^h$ and $w_{n/p}^v$ are the horizontal length, vertical length, horizontal width and vertical width of a net, respectively. $R_{tr}$, $C_L$, $C_{int}$, and $C_{in}$ are the driving resistance, total load capacitance of the net, the total interconnect capacitance of a net and the input capacitance of a sink node, respectively. $c_i$, $r_i$ and $d_i$ are the desired RCD coefficients. The estimated values of $R_{int}$ and $C_{int}$ depend on the length and width of the net. The net length and net width can be estimated during placement based on a bounding box methodology. A bounding box indicates a given physical area (e.g. length by width) in which multiple net routings can exist. In another embodiment, length estimation is accomplished using the single trunk Steiner tree method for single source cells that are connected to multiple sink cells. The trunk method indicates a single bus line that has a branch to each sink. In yet another embodiment, the net width is calculated using the minimum design rule which requires that two nets be placed far apart from each other so that neither net interferes with its neighbor.

In processing block 320, the groups of similar nets are approximated by a linear function. The linear function may be generated using the Least Mean Square method or similar method. RCD coefficients are calculated using the Least Mean Square Method estimation in processing block 325.

For example, for each net in the group, a set of coefficients are found that minimize the following functions F:

$$F_{cap} = \sum_n \left(\frac{C_n - C_n^*}{C_n^*}\right)^2,$$

$$F_{res} = \sum_n \left(\frac{R_n - R_n^*}{R_n^*}\right)^2 \text{ and } F_{delay} = \sum_n \left(\frac{D_n - D_n^*}{D_n^*}\right)^2$$

where $C_n$, $R_n$ and $D_n$ are estimations and $C_n^*$, $R_n^*$ and $D_n^*$ extracted values from analyzer 260. Other methods may be used to find the RCD coefficients.

In processing block 330, the system 200 calculates the average capacitance and resistance error margin for the nets in the group sorted in processing block 315. In one embodiment, the average capacitance and resistance error margin can be represented as $$\frac{\sqrt{F_{cap}}}{N} \text{ and } \frac{\sqrt{F_{res}}}{N}$$

respectively as derived from the LMS method used in processing block 325. The error margin is an accuracy indication that measures the difference between the RCD model estimations of processing block 320 and the actual values of the net extracted by analyzer 260.

In decision block 335, the system 200 determines it the average capacitance and resistance error margin is greater than required by the accuracy level selected by the user in processing block 305. If the error margin is more than the acceptable accuracy level, then flow passes to processing block 350. If the error margin is within the limits of the accuracy level then flow passes to processing block 340.

In processing block 340, the system 200 calculates the average "lumped" resistance and capacitance error margin. In one embodiment, the average lumped error margin can be represented as $$\frac{\sqrt{F_{delay}}}{N}$$

as derived from the LMS method used in processing block 325. The lumped error margin is an accuracy indication that measures the difference between the RCD model estimations generated in processing block 320 and the actual extracted values of the net.

In decision block 345, the system 200 determines if the average lumped capacitance and resistance error margin is greater than the error margin required by the accuracy level selected by the user in processing block 305. If the error margin is more than the acceptable accuracy level, then flow passes to processing block 350. If the error margin is within the limits of the accuracy level, then flow passes to processing block 360, where the RCD model generated in processing block 320 is accepted. A table of RCD coefficients is generated from the RCD model for the new net and provided to the router and placer 230.

In processing block 350, the group of nets from database 240 is divided into subgroups based on the average resistance and capacitance error margin calculated in processing block 330 or based upon the average lumped resistance and capacitance error margin calculated in processing block 340. For example, for each net in the group, if the error margin is less than the error margin required by the selected accuracy level, the net is placed in a first subgroup. If the error margin is greater than required, the net is placed in a second group. Although described with respect to two subgroups, any number of subgroups can be implemented with the present invention. Flow is passed on to processing block 320 where the critical parameters are used to model RCD, characteristics for each net in the subgroup. The process continues until a subgroup is found that has an acceptable error margin that meets the user selected accuracy level. For high levels of accuracy each net in database 240 can have its own RCD model estimations and associated set of coefficients. Thus, a table of coefficients for the new net is generated from the RCD model and provided to router and placer 230. The process completes in processing block 365.

A method and system for dynamically generating resistance, capacitance, and delay table look-ups is disclosed. Although the present invention has been described with respect to specific examples and subsystems, it will be apparent to those of ordinary skill in the art that the invention is not limited to these specific examples or subsystems but extends to other embodiments as well. The present invention includes all of these other embodiments as specified in the claims that follow.

We claim:

1. A method for providing data for a logic cell placing engine, comprising:

receiving statistical data describing a new net;

receiving a value representing a desired level of accuracy;

dividing one or more preexisting net models into one or more groups, wherein the number of groups has an actual level of accuracy;

wherein dividing one or more preexisting net models comprises subdividing the one or more groups until the actual level of accuracy is the desired level of accuracy; and calculating a table of coefficients associated with the statistical data and the one or more groups to the logic cell placing engine.

2. The method as claimed in claim 1, further comprising providing the table of coefficients to a placement engine.

3. The method as claimed in claim 1, wherein each group has an associated coefficient generating function.

4. The method as claimed in claim 1, wherein the statistical data includes net resistance data, net capacitance data, and net delay data.

5. The method as claimed in claim 4, wherein the net delay data includes net length data, a fan data, a number of vias data, a number of jogs data, a neighboring net proximity data, a metal layer data, a number of pins data, and a critical length data.

6. The method of claim 5, wherein the net length data is computed using bounding box and trunk estimation.

7. A system comprising:

means for receiving statistical data describing a new net;

means for receiving a value representing a desired level of accuracy;

means for dividing one or more preexisting net models into one or more groups, wherein the number of groups has an actual level of accuracy;

wherein dividing one or more preexisting net models comprises means for subdividing the one or more groups until the actual level of accuracy is the desired level of accuracy; and means for calculating a table of coefficients associated with the statistical data and the one or more groups to the logic cell placing engine.

8. The system as claimed in claim 7 further comprising:

means for providing the table of coefficients to a placement engine.

9. The system as claimed in claim 7 wherein each group has an associated coefficient generating function.

10. The system as claimed in claim 7, wherein the statistical data includes net resistance data, net capacitance data, and net delay data.

11. The system as claimed in claim 10, wherein the net delay data includes net length data, a fan data, a number of vias data, a number of jogs data, a neighboring net proximity data, a metal layer data, a number of pins data, and a critical length data.

12. The system as claimed in claim 11, wherein the net length data is computed using bounding box and trunk estimation.

13. A computer-readable medium having stored thereon a plurality of instructions, said plurality of instructions when executed by a computer, cause said computer to perform the method of:

receiving statistical data describing a new net;

receiving a value representing a desired level of accuracy;

dividing one or more preexisting net models into one or more groups, wherein the number of groups has an actual level of accuracy;

wherein dividing one or more preexisting net models comprises subdividing the one or more groups until the actual level of accuracy is the desired level of accuracy; and calulating a table of coefficients associated with the statistical data and the one or more groups to the logic cell placing engine.

14. The computer-readable medium of claim 13 having stored thereon additional instructions, said additional instructions when executed by a computer, cause said computer to further perform the method of providing the table of coefficients to a placing engine.

15. The computer-readable medium of claim 13 having stored thereon additional instructions, said additional instructions when executed by a computer, cause said computer to further perform the method of providing each group an associated coefficient generating function.

16. The computer-readable medium of claim 13 having stored thereon-additional instructions, said additional instructions when executed by a computer, cause said computer to further perform the method of providing net resistance data, net capacitance data, and net delay data.

17. The computer-readable medium of claim 16 having stored thereon-additional instructions, said additional instructions when executed by a computer, cause said computer to further perform the method of providing net length data, a fan data, a number of vias data, a number of jogs data, a neighboring net proximity data, a metal layer data, a number of pins data, and a critical length data.

18. The computer-readable medium of claim 17 having stored thereon-additional instructions, said additional instructions when executed by a computer, cause said computer to further perform the method of computing the net length data using bounding box and trunk estimation.

* * * * *

UNITED STATES PATENT AND TRADEMARK OFFICE
CERTIFICATE OF CORRECTION

PATENT NO. : 6,658,631 B1
DATED : December 2, 2003
INVENTOR(S) : Pyo et al.

It is certified that error appears in the above-identified patent and that said Letters Patent is hereby corrected as shown below:

<u>Column 6,</u>
Line 29, delete "it", insert -- if --.

Signed and Sealed this

Twenty-fourth Day of February, 2004

JON W. DUDAS
*Acting Director of the United States Patent and Trademark Office*